US011177162B2

(12) United States Patent
Lanzillo et al.

(10) Patent No.: US 11,177,162 B2
(45) Date of Patent: Nov. 16, 2021

(54) TRAPEZOIDAL INTERCONNECT AT TIGHT BEOL PITCH

(71) Applicant: International Business Machines Corporation, Armonk, NY (US)

(72) Inventors: Nicholas Anthony Lanzillo, Troy, NY (US); Hosadurga Shobha, Niskayuna, NY (US); Huai Huang, Saratoga, NY (US); Junli Wang, Slingerlands, NY (US); Koichi Motoyama, Clifton Park, NY (US); Christopher J. Penny, Saratoga Springs, NY (US); Lawrence A. Clevenger, Saratoga Springs, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/573,225

(22) Filed: Sep. 17, 2019

(65) Prior Publication Data

US 2021/0082744 A1    Mar. 18, 2021

(51) Int. Cl.
*H01L 21/768* (2006.01)
*H01L 23/528* (2006.01)
(Continued)

(52) U.S. Cl.
CPC .. *H01L 21/76804* (2013.01); *H01L 21/76816* (2013.01); *H01L 21/76843* (2013.01);
(Continued)

(58) Field of Classification Search
CPC ......... H01L 21/76816; H01L 21/76804; H01L 21/76843; H01L 21/28568;
(Continued)

(56) References Cited

U.S. PATENT DOCUMENTS

| 5,888,902 A | 3/1999 | Jun |
| 7,098,128 B2 | 8/2006 | Collins et al. |

(Continued)

FOREIGN PATENT DOCUMENTS

CN    109671665 A    4/2019

OTHER PUBLICATIONS

He et al., "Mechanism of Co liner as Enhancement Layer for Cu Interconnect Gap-Fill," Journal of The Electrochemical Society, 160 (12) D3040-D3044 (Jun. 2013).

(Continued)

*Primary Examiner* — Vongsavanh Sengdara
(74) *Attorney, Agent, or Firm* — Randall Bluestone; Michael J. Chang, LLC

(57) ABSTRACT

Techniques for forming trapezoidal-shaped interconnects are provided. In one aspect, a method for forming an interconnect structure includes: patterning a trench(es) in a dielectric having a V-shaped profile with a rounded bottom; depositing a liner into the trench(es) using PVD which opens-up the trench(es) creating a trapezoidal-shaped profile in the trench(es); removing the liner from the trench(es) selective to the dielectric whereby, following the removing, the trench(es) having the trapezoidal-shaped profile remains in the dielectric; depositing a conformal barrier layer into and lining the trench(es) having the trapezoidal-shaped profile; depositing a conductor into and filling the trench(es) having the trapezoidal-shaped profile over the conformal barrier layer; and polishing the conductor and the conformal barrier layer down to the dielectric. An interconnect structure is also provided.

21 Claims, 6 Drawing Sheets

(51) Int. Cl.
*H01L 21/3213* (2006.01)
*H01L 23/532* (2006.01)
*H01L 21/285* (2006.01)

(52) U.S. Cl.
CPC .... *H01L 23/5283* (2013.01); *H01L 21/28568* (2013.01); *H01L 21/32134* (2013.01); *H01L 21/7684* (2013.01); *H01L 23/53238* (2013.01); *H01L 23/53266* (2013.01)

(58) Field of Classification Search
CPC .......... H01L 21/32134; H01L 21/7684; H01L 23/53238; H01L 23/5283; H01L 23/53266
See application file for complete search history.

(56) References Cited

U.S. PATENT DOCUMENTS

| | | | |
|---|---|---|---|
| 7,582,532 B2 | 9/2009 | Han et al. | |
| 7,632,737 B2 | 12/2009 | Rueger et al. | |
| 8,404,594 B2 | 3/2013 | Triyoso et al. | |
| 8,470,706 B2 | 6/2013 | Arnold et al. | |
| 8,608,973 B1 | 12/2013 | Guha | |
| 9,536,832 B1 | 1/2017 | Leobandung | |
| 9,768,060 B2 | 9/2017 | Shaviv et al. | |
| 2004/0259375 A1* | 12/2004 | Derderian | H01L 21/76838 438/758 |
| 2006/0046453 A1* | 3/2006 | Collins | H01L 21/76879 438/597 |
| 2006/0270239 A1 | 11/2006 | Triyoso et al. | |
| 2008/0132050 A1 | 6/2008 | Lavoie | |
| 2013/0037865 A1* | 2/2013 | Nogami | H01L 21/823842 257/288 |
| 2013/0234260 A1 | 9/2013 | Cabral, Jr. et al. | |
| 2014/0183738 A1 | 7/2014 | Jezewski et al. | |
| 2014/0363966 A1 | 12/2014 | Lin et al. | |
| 2015/0295005 A1* | 10/2015 | Tseng | H01L 27/14632 257/446 |
| 2016/0111543 A1* | 4/2016 | Fang | H01L 21/32137 438/592 |
| 2016/0309596 A1 | 10/2016 | Shaviv et al. | |
| 2018/0076133 A1 | 3/2018 | Bonilla et al. | |
| 2018/0096888 A1 | 4/2018 | Naik et al. | |
| 2018/0315704 A1 | 11/2018 | Chen et al. | |

OTHER PUBLICATIONS

Carver et al., "Atomic Layer Etching: An Industry Perspective," ECS Journal of Solid State Science and Technology, 4(6) N5005-5009 (Feb. 2015).

Oehrlein et al., "Atomic Layer Etching at the Tipping Point: An Overview," ECS Journal of Solid State Science and Technology, 4(6) N5041-N5053 (Mar. 2015).

Kanarik et al., "Overview of atomic layer etching in the semiconductor industry," J. Vac. Sci. Technol. A 33(2) (Mar./Apr. 2015) (15 pages).

IBM "Interconnect Wire Structures for the Analysis and Characterization of Resistance and Resistivity" IPCOM000176080D (Nov. 4, 2008) (5 pages).

International Search Report and Written Opinion for PCT/IB2020/057667 dated Nov. 30, 2020 (9 pages).

* cited by examiner

TRAPEZOIDAL INTERCONNECT AT TIGHT BEOL PITCH

FIELD OF THE INVENTION

The present invention relates to interconnect technology, and more particularly, to techniques for forming trapezoidal-shaped interconnects at tight back-end-of-line (BEOL) pitch.

BACKGROUND OF THE INVENTION

With their reduced resistance and improved electromigration, cobalt (Co) and ruthenium (Ru) are considered to be a favorable alternative to traditional interconnect metals like copper (Cu). When forming a Co/Ru-based interconnect, typically a feature (e.g., a trench) is first patterned in a dielectric. The feature is then lined with a thin barrier layer, over which the Co and/or Ru is deposited to form the interconnect.

The barrier layer thickness is an important consideration. Namely, the thicker the barrier is, the less feature area that is available for the Co/Ru fill metal. With reduced feature sizes, the barrier-to-fill metal ratio becomes even more significant as resistance can increase drastically when conductor area is decreased.

As such, techniques for controlling liner thickness are needed for implementing viable interconnect technology with alternate conductors like Co or Ru. Doing so, however, can be a challenge since thin film deposition techniques such as chemical vapor deposition (CVD) and atomic layer deposition (ALD) merely conform to the trench profile further reducing an already-constricted space.

Therefore, improved interconnect fabrication techniques would be desirable.

SUMMARY OF THE INVENTION

The present invention provides techniques for forming trapezoidal-shaped interconnects at tight back-end-of-line (BEOL) pitch. In one aspect of the invention, a method for forming an interconnect structure is provided. The method includes: patterning at least one trench in a dielectric, wherein the at least one trench, as-patterned, has a V-shaped profile with a rounded bottom; depositing a liner into and lining the at least one trench using physical vapor deposition (PVD) which opens-up the at least one trench creating a trapezoidal-shaped profile in the at least one trench; removing the liner from the at least one trench selective to the dielectric whereby, following the removing, the at least one trench having the trapezoidal-shaped profile remains in the dielectric; depositing a conformal barrier layer into and lining the at least one trench having the trapezoidal-shaped profile; depositing a conductor into and filling the at least one trench having the trapezoidal-shaped profile over the conformal barrier layer; and polishing the conductor and the conformal barrier layer down to the dielectric.

In another aspect of the invention, another method for forming an interconnect structure is provided. The method includes: patterning at least one trench in a dielectric, wherein the at least one trench, as-patterned, has a V-shaped profile with a rounded bottom; depositing a liner into and lining the at least one trench using PVD which opens-up the at least one trench creating a trapezoidal-shaped profile in the at least one trench; removing the liner from the at least one trench selective to the dielectric whereby, following the removing, the at least one trench having the trapezoidal-shaped profile remains in the dielectric; depositing a conformal barrier layer into and lining the at least one trench having the trapezoidal-shaped profile using PVD, atomic layer deposition (ALD) or chemical vapor deposition (CVD), wherein the conformal barrier layer includes a material selected from: tantalum (Ta), tantalum nitride (TaN), titanium nitride (TiN), and combinations thereof, and wherein the conformal barrier layer has a thickness of less than about 20 Å; depositing a conductor into and filling the at least one trench having the trapezoidal-shaped profile over the conformal barrier layer, wherein the conductor is selected from: cobalt (Co), ruthenium (Ru), and combinations thereof; and polishing the conductor and the conformal barrier layer down to the dielectric.

In yet another aspect of the invention, yet another method for forming an interconnect structure is provided. The method includes: patterning at least one trench in a dielectric, wherein the at least one trench, as-patterned, has a V-shaped profile with a rounded bottom; depositing a liner into and lining the at least one trench using PVD which opens-up the at least one trench creating a trapezoidal-shaped profile in the at least one trench; removing the liner from the at least one trench selective to the dielectric whereby, following the removing, the at least one trench having the trapezoidal-shaped profile remains in the dielectric; depositing a conformal barrier layer into and lining the at least one trench having the trapezoidal-shaped profile using PVD, ALD or CVD, wherein the conformal barrier layer includes a material selected from: Ta, TaN, TiN, and combinations thereof, and wherein the conformal barrier layer has a thickness of less than about 20 Å; depositing a conformal wetting layer into the at least one trench having the trapezoidal-shaped profile over the barrier layer using ALD or CVD, wherein the conformal wetting layer includes a material selected from: Co, Ru, and combinations thereof, and wherein the conformal wetting layer has a thickness of less than about 30 Å; depositing a conductor into and filling the at least one trench having the trapezoidal-shaped profile over the conformal barrier layer and on the conformal wetting layer, wherein the conductor includes copper (Cu); and polishing the conductor and the conformal barrier layer down to the dielectric.

In still yet another aspect of the invention, an interconnect structure is provided. The interconnect structure includes: at least one trench patterned in a dielectric having a trapezoidal-shaped profile; a conformal barrier layer lining the at least one trench having the trapezoidal-shaped profile, wherein the conformal barrier layer includes a material selected from: Ta, TaN, TiN, and combinations thereof, and wherein the conformal barrier layer has a thickness of less than about 20 Å; and a conductor disposed over the conformal barrier layer in the at least one trench having the trapezoidal-shaped profile.

A more complete understanding of the present invention, as well as further features and advantages of the present invention, will be obtained by reference to the following detailed description and drawings.

DETAILED DESCRIPTION OF PREFERRED EMBODIMENTS

As provided above, during interconnect formation with alternate conductors such as cobalt (Co) or ruthenium (Ru), thin film deposition techniques such as chemical vapor deposition (CVD) and atomic layer deposition (ALD) alone merely produce a barrier layer that conforms to the trench profile, thus further reducing an already-constricted space. As a result, conductor area is minimized leading to an increased interconnect resistance. Use of physical vapor deposition (PVD) for the barrier deposition can create a trapezoidal-shaped trench (i.e., due to ion bombardment against the dielectric). A trapezoidal-shaped trench provides more conductor area. However, a PVD barrier is thick and takes up too much area.

Figure 1:
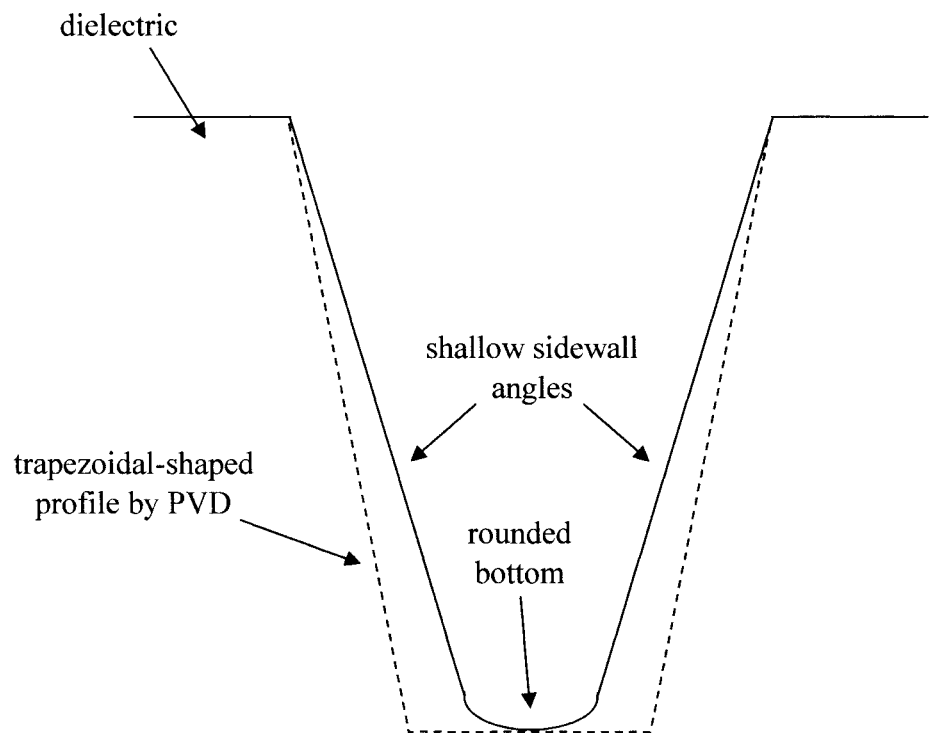
FIG. 1 is a cross-sectional diagram comparing a V-shaped trench profile with a rounded bottom and a trapezoidal-shaped trench profile according to an embodiment of the present invention.

See, for example, FIG. 1. As shown in FIG. 1 a trench, as patterned in a dielectric, has a rounded trench profile and shallow sidewall angles, i.e., a V-shaped profile with a rounded bottom. This V-shaped profile provides only a limited area for the conductor to fill. Thus, if one were to use CVD or ALD to simply deposit the barrier into the trench, this limited area would become even further constricted. As shown in dotted lines in FIG. 1, PVD can be used to 'open-up' the trench (due to ion bombardment), creating a trapezoidal-shaped profile. However, as highlighted above, a PVD layer is too thick and takes up too much of the conductor area.

Advantageously, provided herein are techniques that leverage the benefits of both the thin film capabilities of CVD or ALD and the profile reshaping/enhancing capabilities of PVD by first depositing a thick PVD layer into the trench and thereby creating a trapezoidal-shaped trench profile with increased area, then removing the PVD layer and replacing it with a (thin) CVD, ALD, or PVD barrier.

The present techniques can be implemented in conjunction with alternate conductors such as Co or Ru, as well as with conventional conductors such as copper (Cu). For instance, in a first exemplary embodiment, described in conjunction with the description of FIG. 2-7, an exemplary methodology for forming a Co/Ru interconnect is described. Following that description is a second exemplary embodiment involving the formation of a Cu interconnect using the same PVD then CVD/ALD scheme.

Figure 2:
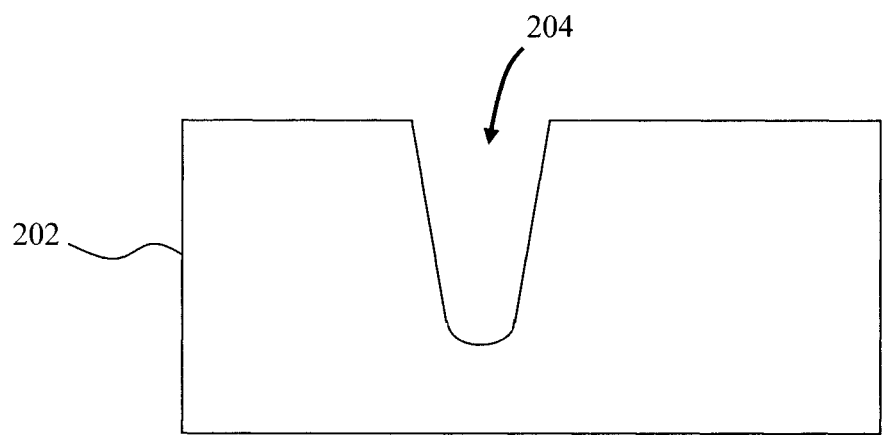
FIG. 2 is a cross-sectional diagram illustrating at least one trench having been patterned in a dielectric whereby the trench, as-patterned, has a V-shaped profile with a rounded bottom according to an embodiment of the present invention.

In the first exemplary embodiment, referring to FIG. 2 the process begins with the patterning of at least one trench 204 in a dielectric 202. Suitable dielectrics 202 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). Standard lithography and etching techniques can be employed to pattern trench 204 in dielectric 202. By way of example only, a directional (i.e., anisotropic) etching process such as reactive ion etching (RIE) can be employed for the trench etch.

As shown in FIG. 2, the as patterned trench 204 has a rounded trench profile and shallow sidewall angles, i.e., a V-shaped profile with a rounded bottom, a shape which unduly limits the area available for conductor fill. Simply lining trench 204 with a conformal barrier or barrier/wetting layer would further reduce this already-restricted conductor area.

Figure 3:
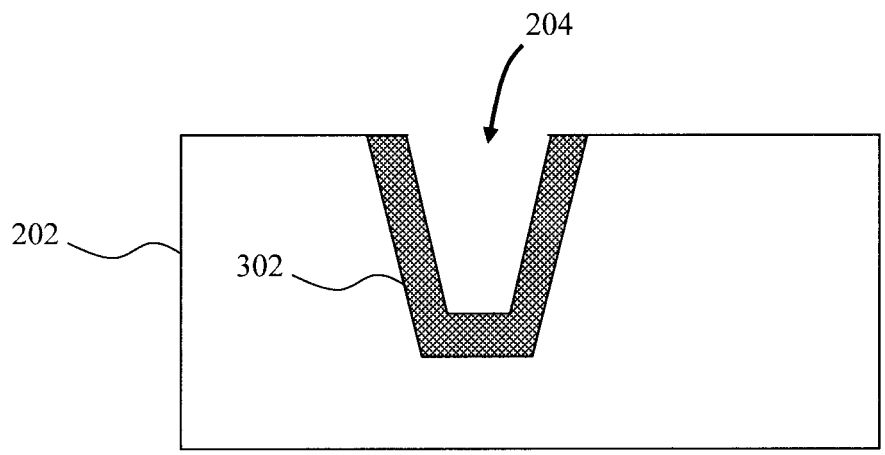
FIG. 3 is a cross-sectional diagram illustrating physical vapor deposition (PVD) having been used to deposit a thick conformal liner into and lining the trench which, due to ion bombardment against the trench sidewalls/bottom, opens-up the trench creating a trapezoidal-shaped profile in trench according to an embodiment of the present invention.

However, as shown in FIG. 3, PVD is first used to deposit a thick conformal liner 302 into and lining trench 204 which, due to ion bombardment against the trench sidewalls/bottom during the PVD process, opens-up trench 204 creating a trapezoidal-shaped profile in trench 204. Suitable liner 302 materials include, but are not limited to, tantalum (Ta), tantalum nitride (TaN) and/or titanium nitride (TiN). According to an exemplary embodiment, liner 302 is deposited to a thickness of greater than about 30 angstroms (Å), e.g., from about 35 Å to about 50 Å, and ranges therebetween.

Even with this now trapezoidal-shaped profile, the thickness of liner 302 occupies a significant amount of the conductor area of trench 204. Thus, filling a conductor over the PVD liner 302 would result in an undesirably high resistance. Advantageously, it is proposed herein to next selectively remove PVD liner 302 from trench 204, leaving behind the trapezoidal-shaped profile, and putting in its place a thinner (PVD, ALD or CVD) barrier layer. Namely, while deposition of a thicker PVD liner (e.g., greater than about 30 Å—see above) is needed to create a trapezoidal-shaped profile in trench 204, thinner layers of deposited PVD do not result in sufficient ion bombardment of the dielectric to open up trench 204 and create a trapezoidal profile. Thus, PVD may also be employed in depositing the replacement barrier, as long as it kept thin (e.g., less than about 20 Å—see below).

Figure 4:
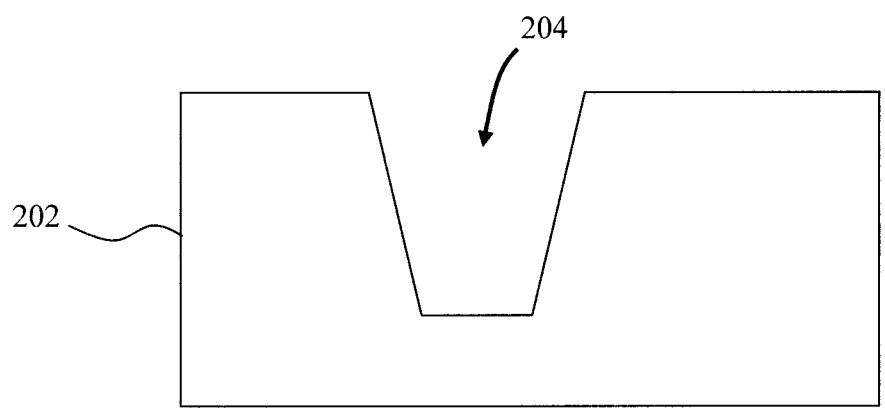
FIG. 4 is a cross-sectional diagram illustrating the PVD liner having been removed from the trench selective to dielectric leaving the (trapezoidal-shaped) trench profile intact according to an embodiment of the present invention.

As shown in FIG. 4, PVD liner 302 has been removed from trench 204 selective to dielectric 202. According to an exemplary embodiment, dielectric 202 is an oxide material such as SiOx, SiCOH and/or pSiCOH (see above), and liner 302 (e.g., Ta, TaN and/or TiN) is removed using a selective etching process such as a selective non-directional (i.e., isotropic) wet chemical etch. Use of a selective etching process leaves the trench profile intact. Thus, what remains is trench 204 having a trapezoidal-shaped profile which beneficially provides an increased conductor area as compared to that of the as-patterned trench (i.e., a V-shaped profile with a rounded bottom—see FIG. 2 (described above)).

Figure 5:
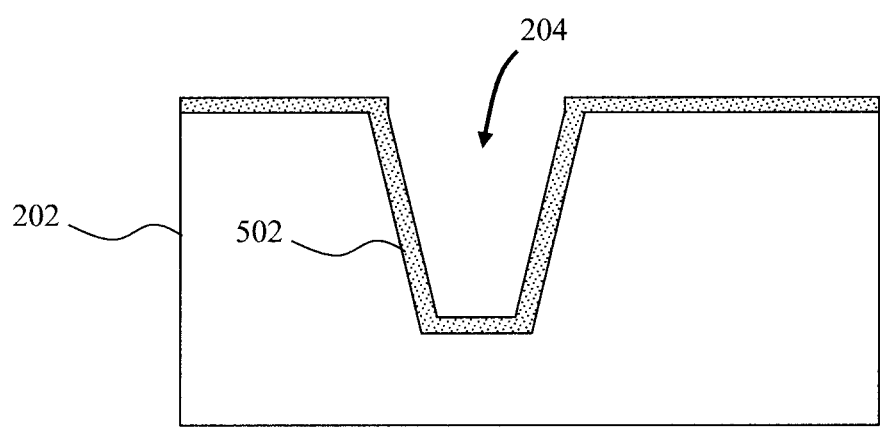
FIG. 5 is a cross-sectional diagram illustrating atomic layer deposition (ALD) or chemical vapor deposition (CVD) having been used to deposit a thin, conformal barrier layer into and lining the (trapezoidal-shaped) trench according to an embodiment of the present invention.

PVD, ALD or CVD is then used to deposit a thin, conformal barrier layer 502 into and lining (trapezoidal-shaped) trench 204. See FIG. 5. As shown in FIG. 5, barrier layer 502 conforms to the trapezoidal-shaped profile of trench 204 (resulting from the deposition and subsequent removal of PVD liner 302). Suitable barrier layer 502 materials include, but are not limited to, Ta, TaN and/or TiN. According to an exemplary embodiment, barrier layer 502 is deposited to a thickness of less than about 20 Å, e.g., from about 10 Å to about 15 Å, and ranges therebetween. As provided above, with these small thicknesses PVD will not create a trapezoidal profile. Barrier layer 502 will prevent diffusion of the conductor (in this case cobalt (Co) and/or ruthenium (Ru)) into the dielectric 202.

As-deposited, barrier layer 502 is disposed with trench 204, as well as on a top surface of dielectric 202. See FIG. 5. However, following conductor fill, the overburden will be removed, e.g., using a process such as chemical mechanical polishing (CMP), and with it the excess barrier layer 502 on top of dielectric 202.

Figure 6:
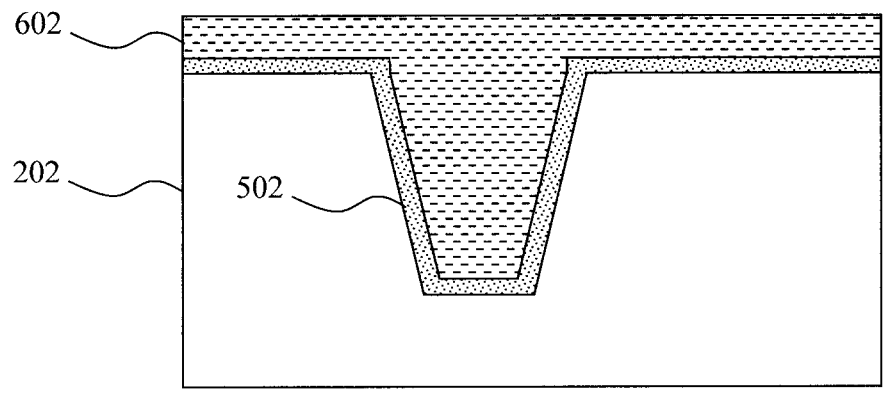
FIG. 6 is a cross-sectional diagram illustrating a conductor (e.g., cobalt (Co) and/or ruthenium (Ru)) having been deposited into, and filling, the (trapezoidal-shaped) trench over the barrier layer according to an embodiment of the present invention.

Namely, a conductor 602 is next deposited into, and filling, (trapezoidal-shaped) trench 204 over barrier layer 502. See FIG. 6. Suitable conductors include, but are not limited to, Co and/or Ru. As highlighted above, embodiments are also presented herein where more traditional conductors such as copper (Cu) are employed. A process such as evaporation, sputtering, electrochemical plating, etc. can be used to deposit conductor 602 into trench 204. As shown in FIG. 6, as deposited the conductor 602 overfills trench 204. This overburden is then removed to avoid shorting to adjacent structures.

Figure 7:
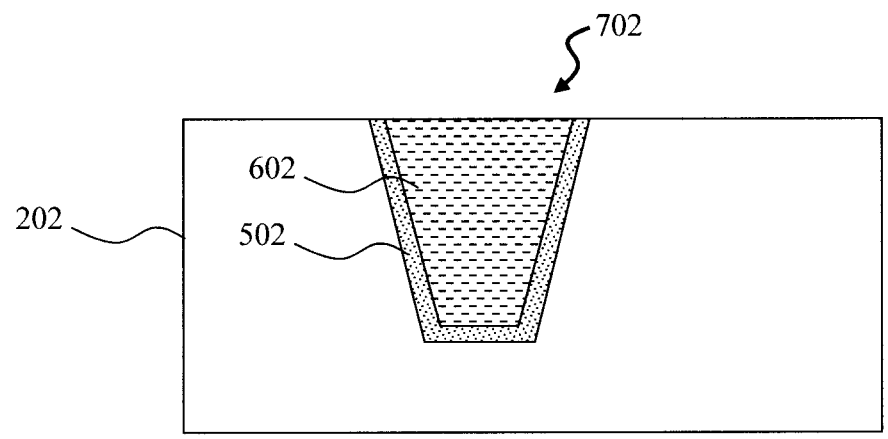
FIG. 7 is a cross-sectional diagram illustrating the conductor and the barrier layer having been polished down to the surface of the dielectric according to an embodiment of the present invention.

For instance, as shown in FIG. 7, a process such as CMP is used to polish conductor 602 and barrier layer 502 down to the surface of dielectric 202. The result is a trapezoidal-shaped (Co and/or Ru) interconnect 702 embedded in dielectric 202 having a thin (e.g., less than about 20 Å, e.g., from about 10 Å to about 15 Å, and ranges therebetween—see above) conformal barrier layer 502 separating conductor 602 from dielectric 202.

As highlighted above, the present techniques can also be implemented in conjunction with conventional conductors such as Cu. For instance, in another exemplary embodiment, described in conjunction with the description of FIG. 8-13, an exemplary methodology for forming a Cu interconnect is described.

Figure 8:
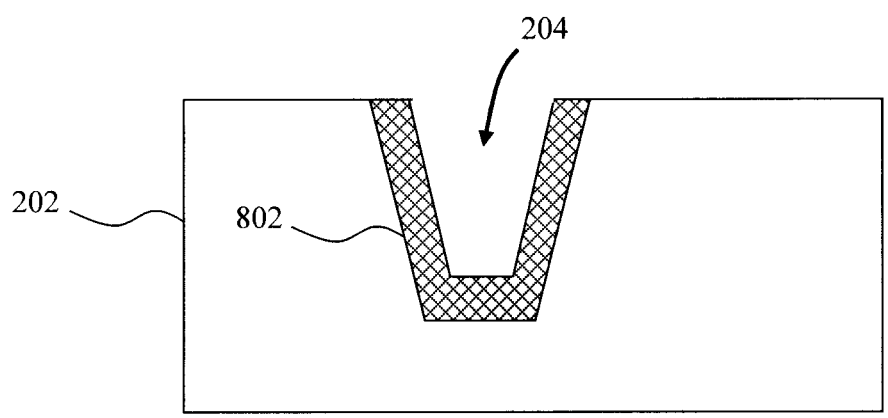
FIG. 8 is a cross-sectional diagram, which follows from FIG. 2, illustrating according to an alternative embodiment PVD having been used to deposit a thick conformal liner into and lining trench which, due to ion bombardment against the trench sidewalls/bottom, opens-up the trench creating a trapezoidal-shaped profile in trench according to an embodiment of the present invention.

The process begins in the same general manner as the example above, with the patterning of at least one trench 204 in a dielectric 202 (e.g., SiOx, SiCOH and/or pSiCOH). As such, what is depicted in FIG. 8 follows from the structure shown in FIG. 2, and like structures are numbered alike in the figures. As described above, with an etching process such as RIE the as-patterned trench 204 will have a rounded trench profile and shallow sidewall angles, i.e., a V-shaped profile with a rounded bottom. This shape unduly limits the area available for conductor fill. Thus, simply lining trench 204, in this case with a barrier layer and wetting layer, would further reduce this already-restricted conductor area.

Thus, as shown in FIG. 8, PVD is used to deposit a thick conformal liner 802 into and lining trench 204. As described above, ion bombardment against the trench sidewalls/bottom during the PVD process serves to open-up trench 204 creating a trapezoidal-shaped profile in trench 204. Suitable liner 802 materials include, but are not limited to, Ta, TaN and/or TiN. According to an exemplary embodiment, liner 802 is deposited to a thickness of greater than about 30 Å, e.g., from about 35 Å to about 50 Å, and ranges therebetween.

As shown in FIG. 8, trench 204 now has a trapezoidal-shaped profile. As detailed above, the thick PVD liner 802 needs to be removed to increase conductor area. In this embodiment, doing so enables the placement, e.g., using PVD, ALD or CVD, of a thin barrier layer as well as a thin wetting layer to enhance Cu gap-fill properties. Thus, PVD liner 802 is next selectively removed from trench 204. See FIG. 9.

Figure 9:
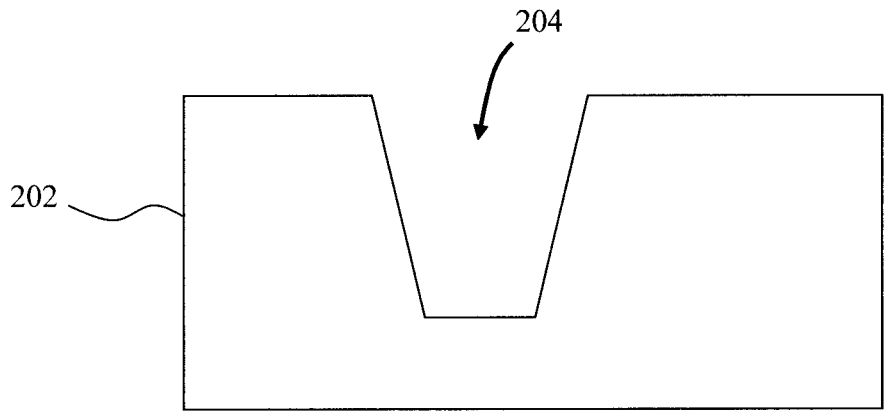
FIG. 9 is a cross-sectional diagram illustrating the PVD liner having been removed from the trench selective to dielectric leaving the (trapezoidal-shaped) trench profile intact according to an embodiment of the present invention.

As shown in FIG. 9, PVD liner 802 has been removed from trench 204 selective to dielectric 202. According to an exemplary embodiment, dielectric 202 is an oxide material such as SiOx, SiCOH and/or pSiCOH (see above), and liner 802 (e.g., Ta, TaN and/or TiN) is removed using a selective etching process such as a selective non-directional (i.e., isotropic) wet chemical etch. Use of a selective etching process leaves the trench profile intact. Thus, as shown in FIG. 9, what remains is trench 204 having a trapezoidal-shaped profile which beneficially provides an increased conductor area as compared to that of the as-patterned trench (i.e., a V-shaped profile with a rounded bottom—see FIG. 2 (described above)).

Figure 10:
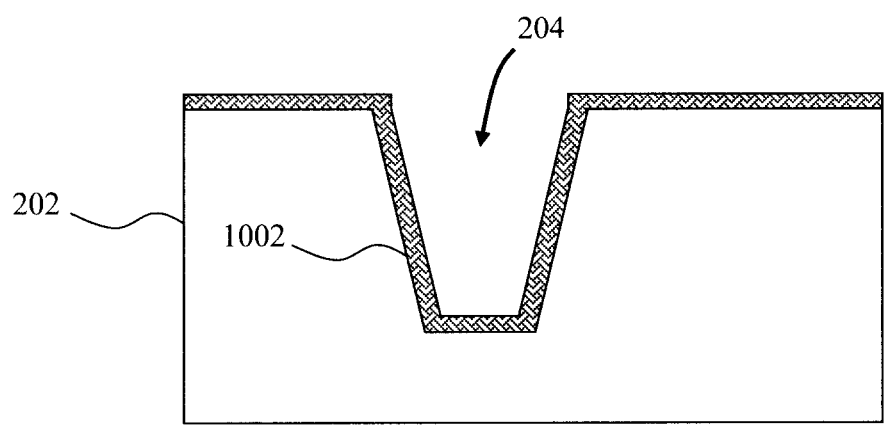
FIG. 10 is a cross-sectional diagram illustrating ALD or CVD having been used to deposit a thin, conformal barrier layer into and lining the (trapezoidal-shaped) trench according to an embodiment of the present invention.
Figure 11:
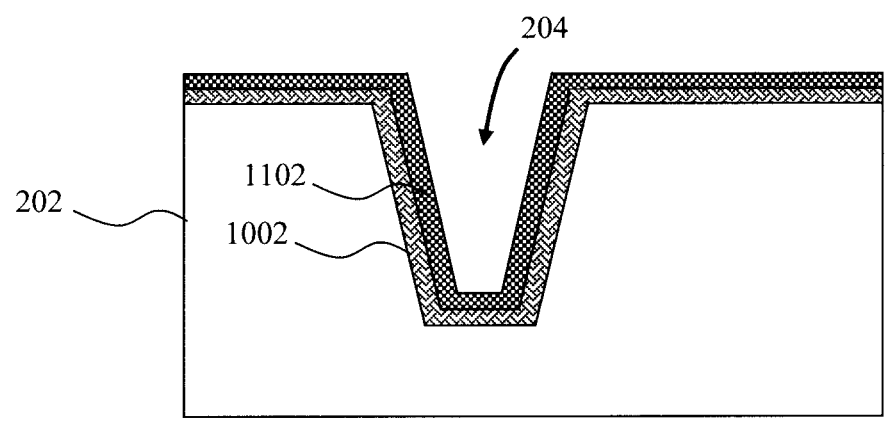
FIG. 11 is a cross-sectional diagram illustrating ALD or CVD having been used to deposit a thin, conformal wetting layer into the (trapezoidal-shaped) trench over the barrier layer according to an embodiment of the present invention.

Next, as shown in FIG. 10, PVD, ALD or CVD is used to deposit a thin conformal barrier layer 1002 into and lining (trapezoidal-shaped) trench 204. Barrier layer 1002 conforms to the trapezoidal-shaped profile of trench 204 (resulting from the deposition and subsequent removal of the thick PVD liner 802). Suitable barrier layer 1002 materials include, but are not limited to, Ta, TaN and/or TiN. According to an exemplary embodiment, barrier layer 1002 is deposited to a thickness of less than about 20 Å, e.g., from about 10 Å to about 15 Å, and ranges therebetween. As provided above, with these small thicknesses PVD will not create a trapezoidal profile. Barrier layer 1002 will prevent diffusion of the wetting layer materials (in this case Co and/or Ru) and/or conductor (in this case Cu) into the dielectric 202.

In order to enhance the Cu gap-fill properties, ALD or CVD is next used to deposit a thin, conformal wetting layer 1102 into (trapezoidal-shaped) trench 204 over the barrier layer 1002. See FIG. 11. Suitable wetting layer 1102 materials include, but are not limited to, Co and/or Ru. The filling of Cu over Co/Ru has notable benefits. For instance, Cu has excellent wetting on Ru, and Cu wets Co better than Ta. According to an exemplary embodiment, wetting layer 1102 is deposited to a thickness of less than about 30 Å, e.g., from about 15 Å to about 20 Å, and ranges therebetween.

As-deposited, barrier layer 1002 and wetting layer 1102 are disposed within trench 204, as well as on a top surface of dielectric 202. See FIG. 11. However, following conductor fill, the overburden will be removed, e.g., using a process such as CMP, and with it the excess barrier layer 1002 and wetting layer 1102 on top of dielectric 202.

Figure 12:
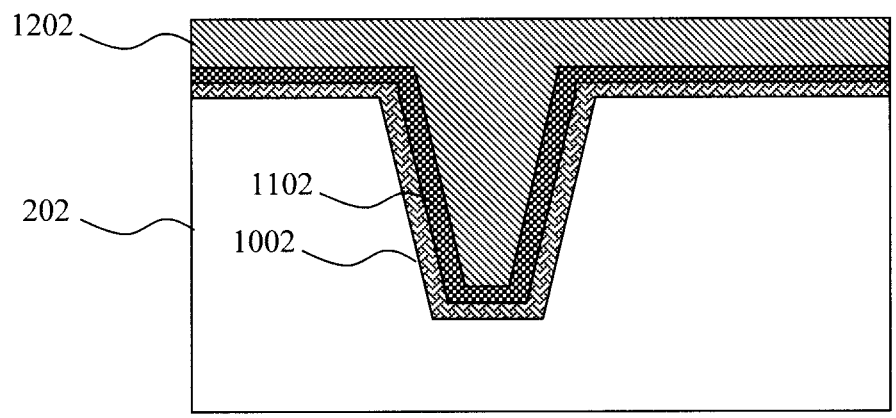
FIG. 12 is a cross-sectional diagram illustrating a conductor (e.g., copper (Cu)) having been deposited into, and filling, the (trapezoidal-shaped) trench over the barrier layer and on the wetting layer according to an embodiment of the present invention.

Namely, a conductor 1202 is next deposited into, and filling, (trapezoidal-shaped) trench 204 over barrier layer 1002 and on wetting layer 1102. See FIG. 12. In this exemplary embodiment, conductor 1202 includes, but is not limited to, Cu. A process such as evaporation, sputtering, electrochemical plating, etc. can be used to deposit conductor 1202 into trench 204. As shown in FIG. 12, as deposited the conductor 1202 overfills trench 204. This overburden is then removed to avoid shorting to adjacent structures.

Figure 13:
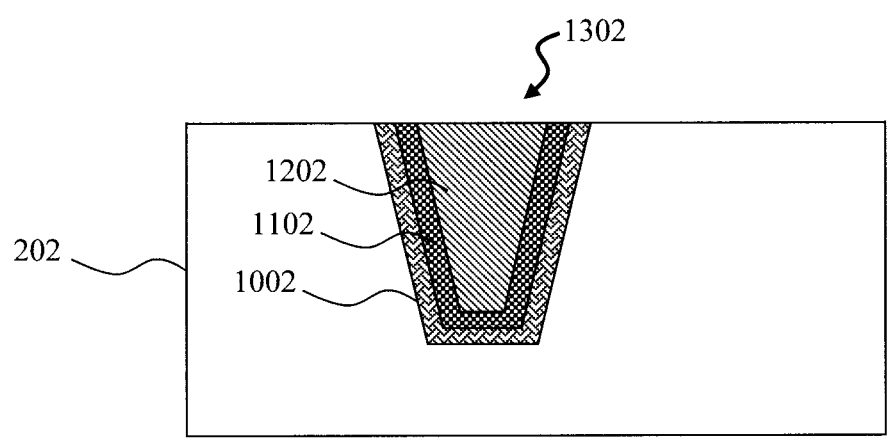
FIG. 13 is a cross-sectional diagram illustrating the conductor, the barrier layer, and the wetting layer having been polished down to the surface of the dielectric according to an embodiment of the present invention.

For instance, as shown in FIG. 13, a process such as CMP is used to polish conductor 1202, barrier layer 1002, and wetting layer 1102 down to the surface of dielectric 202. The result is a trapezoidal-shaped (Cu) interconnect 1302 embedded in dielectric 202 having a thin (e.g., less than about 20 Å, e.g., from about 10 Å to about 15 Å, and ranges therebetween—see above) conformal barrier layer 1002 and a thin conformal (e.g., less than about 30 Å, e.g., from about 15 Å to about 20 Å, and ranges therebetween—see above) wetting layer 1102 separating conductor 1202 from dielectric 202.

Figure 14:
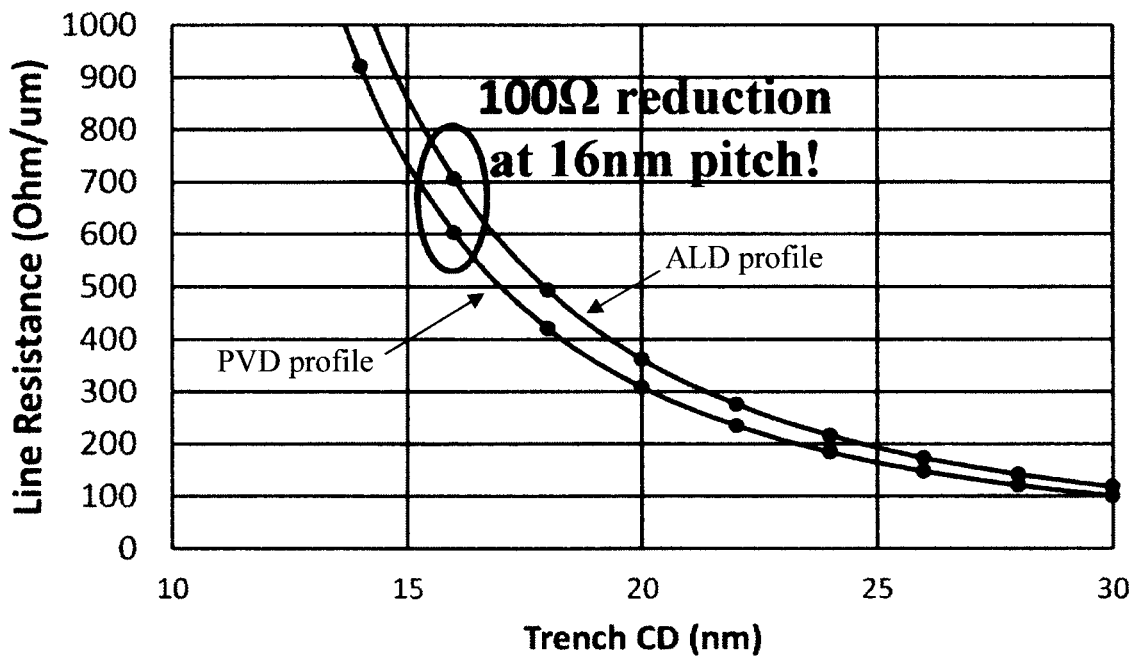
FIG. 14 is a diagram illustrating a lower line resistance for interconnects formed in a trapezoidal-shaped trench as compared to interconnects formed in a V-shaped profile trench according to an embodiment of the present invention.

The present techniques are further described by way of reference to the following non-limiting examples. First, as shown in FIG. 14, for Co interconnects formed using the present techniques having a height-to-width aspect ratio of 1.5 and a trapezoidal-shaped trench profile with a 2 nm thick ALD barrier layer (labeled "PVD profile"), a 15% lower R/C is seen as compared to a corresponding trench with a V-shaped profile with a rounded bottom (labeled "ALD profile"). In FIG. 14, trench critical dimension (CD) (measured in nanometers (nm)) is plotted on the X-axis, and line resistance (measured in Ohms per micrometer (Ohm/μm)) is plotted on the Y-axis. The lower line resistance for the interconnects formed in a trapezoidal-shaped trench is attributable to the increased amount of conductor, as compared to interconnects formed in a V-shaped profile (i.e., as-patterned) trench.

Figure 15:
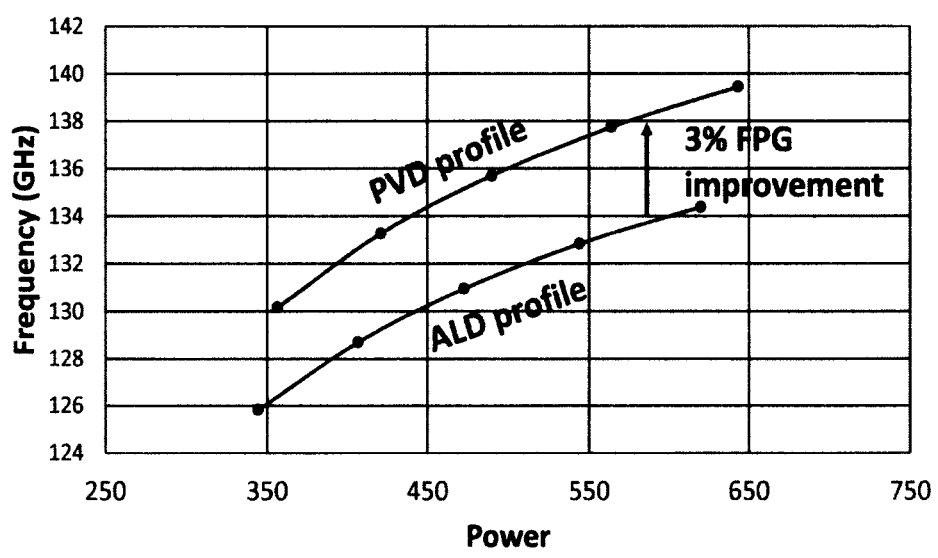
FIG. 15 is a diagram illustrating an increased chip performance utilizing interconnects formed in a trapezoidal-shaped trench as compared to interconnects formed in a V-shaped profile trench according to an embodiment of the present invention.

FIG. 15 is a diagram illustrating an increased chip performance again attributable to the increased amount of conductor in the interconnects formed in the trapezoidal-shaped trench (labeled "PVD profile"), as compared to interconnects formed in a V-shaped profile (i.e., as-patterned) trench (labeled "ALD profile"). Namely, in this example, a 3% frequency performance gauge (FPG) improvement was shown for a 5 nm VTFET using the present V-shaped profile Co interconnect design with 30 nm pitch in the back-end-of-line (BEOL). FPG is a measure of the maximum frequency at which a chip can operate, i.e., the higher the frequency the faster/more powerful the chip. In FIG. 15, power is plotted on the X-axis, and frequency (measured in Gigahertz (GHz)) is plotted on the Y-axis.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming an interconnect structure, the method comprising:
   patterning at least one trench in a dielectric, wherein the at least one trench, as-patterned, has a V-shaped profile with a rounded bottom;
   depositing a liner into and lining the at least one trench using physical vapor deposition (PVD) which opens-up the at least one trench by reshaping sidewalls and a bottom of the at least one trench to enlarge the at least one trench and create a trapezoidal-shaped profile in the at least one trench;
   removing the liner from the at least one trench selective to the dielectric whereby, following the removing, the at least one trench having the trapezoidal-shaped profile remains in the dielectric;
   depositing a conformal barrier layer into and lining the at least one trench having the trapezoidal-shaped profile;
   depositing a conductor into and filling the at least one trench having the trapezoidal-shaped profile over the conformal barrier layer; and
   polishing the conductor and the conformal barrier layer down to the dielectric.

2. The method of claim 1, wherein the dielectric is selected from the group consisting of: silicon oxide (SiOx), organosilicate glass (SiCOH), porous organosilicate glass (pSiCOH) and combinations thereof.

3. The method of claim 1, wherein the liner comprises a material selected from the group consisting of: tantalum (Ta), tantalum nitride (TaN), titanium nitride (TiN), and combinations thereof.

4. The method of claim 1, wherein the liner has a thickness of greater than about 30 Å.

5. The method of claim 1, wherein the liner has a thickness of from about 35 Å to about 50 Å, and ranges therebetween.

6. The method of claim 1, wherein the conformal barrier layer comprises a material selected from the group consisting of: Ta, TaN, TiN, and combinations thereof.

7. The method of claim 1, wherein the conformal barrier layer has a thickness of less than about 20 Å.

8. The method of claim 1, wherein the conformal barrier layer has a thickness of from about 10 Å to about 15 Å, and ranges therebetween.

9. The method of claim 1, wherein the conformal barrier layer is deposited using PVD, atomic layer deposition (ALD) or chemical vapor deposition (CVD).

10. The method of claim 1, wherein the conductor is selected from the group consisting of: cobalt (Co), ruthenium (Ru), and combinations thereof.

11. The method of claim 1, wherein the conductor comprises copper (Cu).

12. The method of claim 11, further comprising:
    depositing a conformal wetting layer into the at least one trench having the trapezoidal-shaped profile over the barrier layer, wherein the conformal wetting layer is deposited prior to the conductor.

13. The method of claim 12, wherein the conformal wetting layer comprises a material selected from the group consisting of: Co, Ru, and combinations thereof.

14. The method of claim 12, wherein the conformal wetting layer has a thickness of less than about 30 Å.

15. The method of claim 12, wherein the conformal wetting layer has a thickness of from about 15 Å to about 20 Å, and ranges therebetween.

16. The method of claim 12, wherein the conformal wetting layer is deposited using ALD or CVD.

17. A method for forming an interconnect structure, the method comprising:
    patterning at least one trench in a dielectric, wherein the at least one trench, as-patterned, has a V-shaped profile with a rounded bottom;
    depositing a liner into and lining the at least one trench using physical vapor deposition (PVD) which opens-up the at least one trench by reshaping sidewalls and a bottom of the at least one trench to enlarge the at least one trench and create a trapezoidal-shaped profile in the at least one trench;
    removing the liner from the at least one trench selective to the dielectric whereby, following the removing, the at least one trench having the trapezoidal-shaped profile remains in the dielectric;
    depositing a conformal barrier layer into and lining the at least one trench having the trapezoidal-shaped profile using PVD, atomic layer deposition (ALD) or chemical vapor deposition (CVD), wherein the conformal barrier layer comprises a material selected from the group consisting of: tantalum (Ta), tantalum nitride (TaN), titanium nitride (TiN), and combinations thereof, and wherein the conformal barrier layer has a thickness of less than about 20 Å;
    depositing a conductor into and filling the at least one trench having the trapezoidal-shaped profile over the conformal barrier layer, wherein the conductor is selected from the group consisting of: cobalt (Co), ruthenium (Ru) and combinations thereof; and
    polishing the conductor and the conformal barrier layer down to the dielectric.

18. The method of claim 17, wherein the conformal barrier layer has a thickness of from about 10 Å to about 15 Å, and ranges therebetween.

19. A method for forming an interconnect structure, the method comprising:
    patterning at least one trench in a dielectric, wherein the at least one trench, as-patterned, has a V-shaped profile with a rounded bottom;
    depositing a liner into and lining the at least one trench using physical vapor deposition (PVD) which opens-up the at least one trench by reshaping sidewalls and a bottom of the at least one trench to enlarge the at least one trench and create a trapezoidal-shaped profile in the at least one trench;
    removing the liner from the at least one trench selective to the dielectric whereby, following the removing, the at least one trench having the trapezoidal-shaped profile remains in the dielectric;
    depositing a conformal barrier layer into and lining the at least one trench having the trapezoidal-shaped profile using PVD, atomic layer deposition (ALD) or chemical vapor deposition (CVD), wherein the conformal barrier layer comprises a material selected from the group consisting of: tantalum (Ta), tantalum nitride (TaN), titanium nitride (TiN), and combinations thereof, and wherein the conformal barrier layer has a thickness of less than about 20 Å;
    depositing a conformal wetting layer into the at least one trench having the trapezoidal-shaped profile over the barrier layer using ALD or CVD, wherein the conformal wetting layer comprises a material selected from the group consisting of: cobalt (Co), ruthenium (Ru), and combinations thereof, and wherein the conformal wetting layer has a thickness of less than about 30 Å;
    depositing a conductor into and filling the at least one trench having the trapezoidal-shaped profile over the conformal barrier layer and on the conformal wetting layer, wherein the conductor comprises copper (Cu); and
    polishing the conductor and the conformal barrier layer down to the dielectric.

20. The method of claim 19, wherein the conformal barrier layer has a thickness of from about 10 Å to about 15 Å, and ranges therebetween.

21. The method of claim 19, wherein the conformal wetting layer has a thickness of from about 15 Å to about 20 Å, and ranges therebetween.

* * * * *